United States Patent [19]

Kostelnicek

[11] 4,059,818

[45] Nov. 22, 1977

[54] PERIODIC WAVEFORM INTERFERENCE ELIMINATOR

[75] Inventor: Richard J. Kostelnicek, Houston, Tex.

[73] Assignee: Exxon Production Research Company, Houston, Tex.

[21] Appl. No.: 678,010

[22] Filed: Apr. 19, 1976

[51] Int. Cl.² .................... G01V 1/36; H03B 1/04
[52] U.S. Cl. ................. 340/15.5 DP; 340/15.5 F; 340/15.5 CF; 328/165
[58] Field of Search ............... 340/15.5 CP, 15.5 DP, 340/15.5 F, 15.5 SC, 15.5 CC, 15.5 CF; 328/165, 166, 167; 325/474, 475, 476, 378; 343/7 A

[56] References Cited

U.S. PATENT DOCUMENTS

| | | | |
|---|---|---|---|
| 3,696,203 | 10/1972 | Leonard | 325/476 |
| 3,757,235 | 9/1973 | McCormick et al. | 328/166 |
| 3,889,229 | 6/1975 | Kostelnicek et al. | 328/165 |
| 3,894,219 | 7/1975 | Weigel | 340/15.5 CF |

Primary Examiner—Maynard R. Wilbur
Assistant Examiner—Lawrence Goodwin
Attorney, Agent, or Firm—E. Eugene Thigpen

[57] ABSTRACT

A system is disclosed for removing a periodic interfering signal from an electrical signal which may also include a data signal such as a seismic signal. A digital representation of the interfering signal, comprising a series of digital words, is generated and a nulling signal formed from this digital signal is subtracted from said electrical signal. The amplitude difference between said electrical signal and the nulling signal is determined and the digital words comprising the digital representation of the interfering signal are changed by a function of the difference between said electrical signal and said nulling signal, to reduce said difference.

11 Claims, 6 Drawing Figures

PERIODIC WAVEFORM INTERFERENCE ELIMINATOR

BACKGROUND OF THE INVENTION

1. Field of the Invention

This invention relates generally to seismic exploration and more particularly to a system for removing a periodic interfering signal from an electrical signal that includes a seismic signal.

2. Description of the Prior Art

The problem of eliminating from recordings of geophone signals certain interfering signals that are picked up by the long leads that are customarily used for connecting geophone to recorders is not a new one. Various systems have been developed for eliminating such interfering signals, which, typically, are generated by power lines and are periodic in nature. Notch filters have been used for many years for this purpose. A difficulty with notch filters is that they produce phase distortion in signal frequencies near the frequency eliminated by the filter. Such filters, typically, remove only the fundamental frequency of an interference signal, and additional notch filters would be required to eliminate harmonics of the fundamental frequency.

Systems have also been developed for generating a monochromatic nulling signal substantially equal to the fundamental frequency component of the interfering signal and subtracting this nulling signal from the electrical data signal. In systems such as disclosed in U.S. Pat. No. 2,733,412, Alexander, the nulling signal is manually adjusted by an operator to have the desired amplitude, phase, and frequency. More recently, systems which automatically vary the amplitude, phase, and frequency of a monochromatic nulling signal have been developed, as evidenced by U.S. Pat. Nos. 3,889,229, Kostelnicek et al, and 3,757,235, McCormick. These systems are capable of removing the fundamental frequency component of an unwanted periodic signal, but they do not remove the 2nd or higher harmonics which may be of significant amplitude.

SUMMARY OF THE INVENTION

The invention disclosed herein is a system for removing a periodic interfering signal from an electrical signal that includes a data signal, such as a geophone output signal, and the interfering signal. The system includes means for generating a nulling signal having substantially the same periodic waveform as the interfering signal. The nulling signal is subtracted from the electrical signal. The difference between the nulling signals and interfering signal is sampled at selected intervals to generate an error signal. A portion of the error signal is then combined with the nulling signal to correct the nulling signal so that the interfering signal is more completely removed.

DESCRIPTION OF A PREFERRED EMBODIMENT

Figure 1:
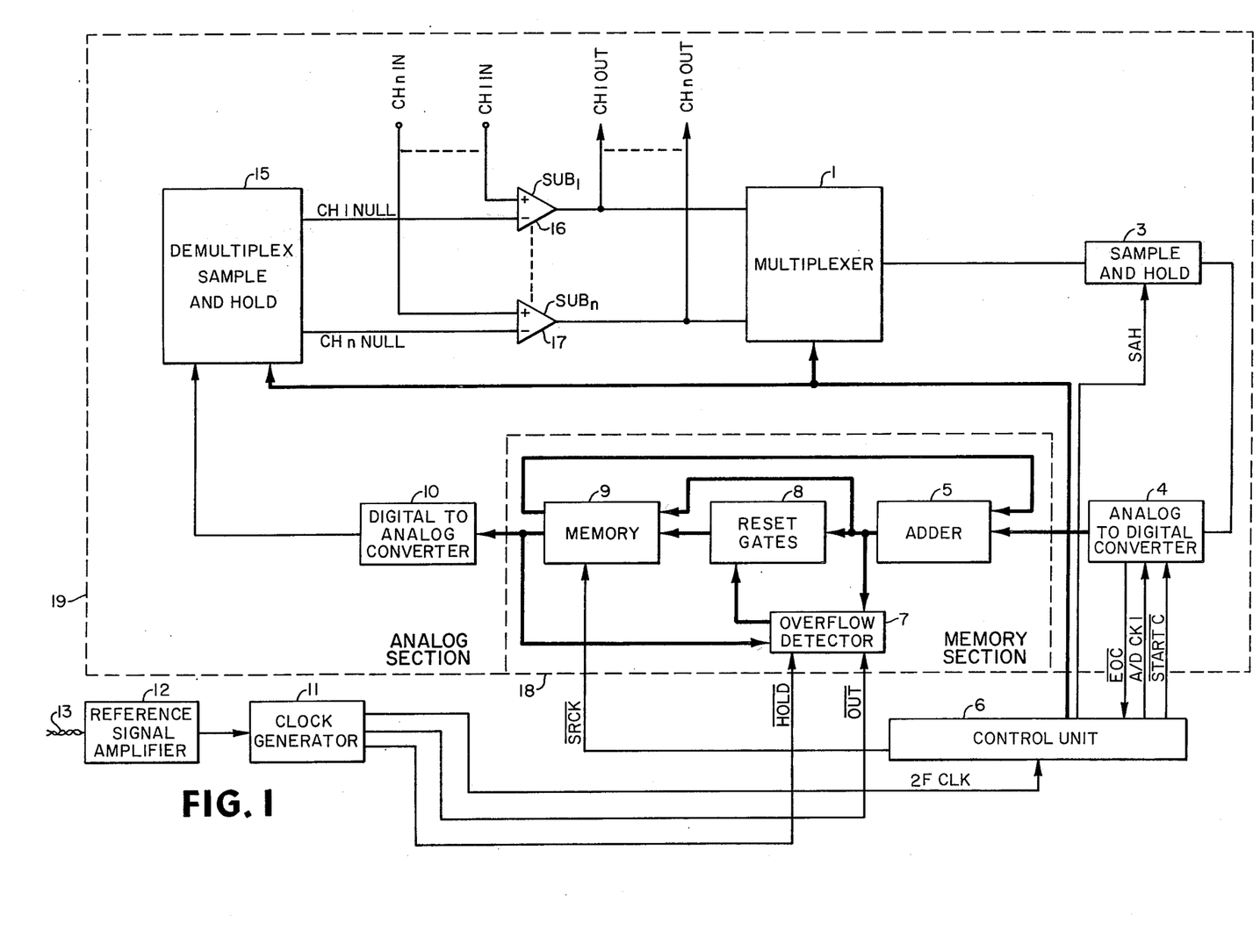
FIG. 1 is a schematic block diagram of a preferred embodiment of the invention.

FIG. 1 shows a block diagram of a preferred embodiment of the invention. Although the more detailed drawings in FIGS. 2–6 show a system for handling six data channels, the system is easily adaptable to handle a different number of data channels. The block diagram, therefore, shows an indefinite number of data channels. Input signals, which normally will be the output signals from geophones, are shown at the top of FIG. 1 designated as Ch 1 In - Ch $n$ In (Channel 1 In through Channel $n$ In).

Ch 1 In input signal is shown connected to the plus (+) terminal of amplifier 16. Ch 1 Null signal is shown connected to the negative (−) terminal of this amplifier. Amplifier 16, designated as $SUB_1$, subtracts Ch 1 Null signal from Ch 1 In signal. The output of this amplifier normally will be the system output signal that is recorded for seismic data analysis, and is designated on FIG. 1 as Ch 1 Out. The system will include a separate subtracting amplifier for each data channel. Subtracting amplifier 17, also designated as $SUB_n$, represents the n'th, or last, of a series of subtracting amplifiers, one for each channel. The output signals from these subtracting amplifiers are connected to inputs of multiplexer 1. This multiplexer operates in response to control signals from Control Unit 6. The multiplexer sequentially transfers the output signals from the subtracting amplifiers onto a single output line shown connected to the input of sample-and-hold circuit 3. Sample-and-hold circuit 3, operating in response to the SAH (Sample and Hold) signal coming from the Control Unit, presents voltage levels to analog-to-digital converter 4 equal to the voltage level of the input signals thereto at the sampling time. Analog-to-digital converter 4 operates in response to control signals from Control Unit 6 to convert the voltage level signals into equivalent binary digital signals. The output signal from each of the subtracting amplifiers is sampled a multiplicity of times for each period of the unwanted interfering signal. Multiplexer 1 sequences through all the channels, presenting a segment of each subtracting amplifier output to the sample-and-hold circuit in sequence. After the multiplexer has sequenced through all channels, it repeats, and presents a second segment of each subtracting amplifier output to sample-and-hold circuit 3. Enough samples are taken during each period of the interfering signal to adequately characterize the waveform of the output signal from each subtracting amplifier. In a preferred embodiment of the invention, 42 samples of each channel are taken per period of the unwanted periodic signal.

The binary digital signals from analog-to-digital converter 4 are presented to adder 5 along with the digital word then appearing at memory 9 output. The digital word at the output of analog-to-digital converter 4 represents the difference between corresponding Channel In signals and Channel Null signals during a particular time interval. The digital word at the output of memory 9 is the digital word from which the particular Channel Null signal was constructed during that particular time interval. Adder 5 alegbraically combines a fractional portion of the digital word from the output of analog-to-digital converter 4 with the digital word at the output of memory 9.

The adder 5 output is then presented to reset gates 8 and to overflow detector 7. Overflow detector 7 determines if the digital word output from the adder is at or exceeds the full scale capability of the Memory Section. If this number is at or in excess of full scale, then a signal representing full scale amplitude, either positive or negative, whichever the case may be, is selected to be placed back into memory 9. If the signal is within full scale, then the output digital word from the adder will be replaced in memory.

Also shown coming from Clock Generator 11 to the overflow detector are signals designated as OUT and HOLD which will be further discussed hereinafter with respect to FIGS. 3 and 5. When the OUT signal goes to a ZERO state, digital words comprised of all ZERO's are placed in memory. When the HOLD signal goes to a ZERO state, the digital words then present in memory are simply recirculated rather than updated by the output from adder 5.

After it is determined what digital word value is to be replaced in the memory; that is, whether it is to be the signal appearing at the output of adder 5, or a full scale count, or all ZERO's, the word is restored in memory and the memory is shifted so that the succeeding digital word appears at the output thereof. This succeeding digital word will be representative of the amplitude of a segment of the interfering signal appearing on the succeeding data Channel In. This new word is then transformed into an equivalent analog voltage level by digital-to-analog converter 10 and presented to the demultiplex sample-and-hold circuit 15. The demultiplex sample-and-hold circuit operates in response to control signals from Control Unit 6 to present the new analog voltage level at the appropriate Channel Null output. These output signals, called Ch 1 Null through Ch n Null in FIG. 1 are presented to the appropriate subtracting amplifier and this level is subtracted from the data Channel In signal.

The clock input signal to the Control Unit, designated as 2F CLK, is normally locked to the interference signal fundamental frequency to operate the system in synchronism with the interfering signal. The interfering signal is picked up on an antenna which may be comprised of a seismic cable 13. Reference Signal Amplifier 12 creates a clean signal at this frequency. Clock Generator 11 is comprised of a phase-locked loop circuit which generates a clock frequency locked to the phase of the output signal from reference signal amplifier 12. Control Unit 6 then operates from Clock Generator 11 to generate the control signals for use throughout the system.

Figure 2:
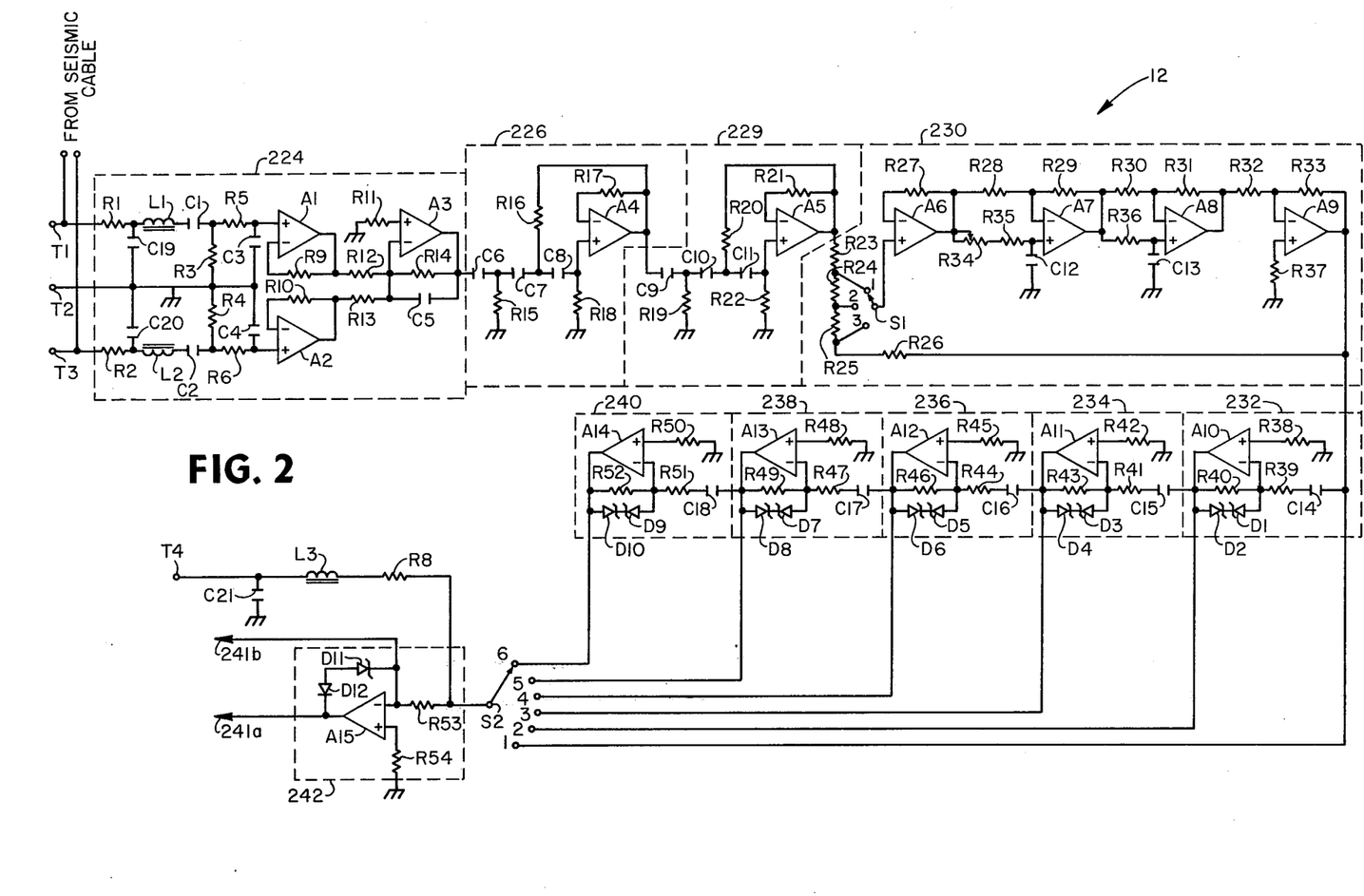
FIG. 2 is a circuit diagram of apparatus suitable for use as the reference signal amplifier illustrated in FIG. 1.

FIG. 2 shows a circuit that may be used for Reference Signal Amplifier 12 to generate a "clean" signal at the fundamental frequency of the unwanted interfering signal.

In seismic systems, normally, a seismic detector cable will extend for a mile or two from a recording vehicle. This cable will pick up a substantial amount of interference from power distribution lines in the area. The seismic signal itself will appear as a differential signal between two input lines. The interference signal, however, will appear as a common mode signal on both the lines, as well as the differential mode signal between the lines. The circuit shown in FIG. 2 is designed to attenuate the differential signal and to amplify the common mode signal.

The two seismic signal lines are coupled into common mode enhancement amplifier 224 through input terminals T1 and T3. In a typical seismic system, a high frequency RF signal is present in the area and the circuit shown in FIG. 2 will be enclosed in an electromagnetically shielded box. The seismic signal lines are coupled into the shielded box through ferrite bead single-turn inductors L1 and L2, shunted by feedthrough capacitors C19 and C20, to attenuate the RF signal. Capacitors C1 and C2 function as DC isolation capacitors. RC networks R5-C3 and R6-C4 function as single pole, low pass filters with a cutoff frequency of approximately 250 Hz. The signal is then amplified by amplifiers A1 and A2 and summed together at the input of amplifier A3. The common connection at the input of amplifier A3 substantially eliminates any differential signal appearing between terminals T1 and T3 and sums the common mode signal. Amplifier A3 and associated components comprise another single pole, low pass filter having a cutoff frequency of approximately 60 Hz, to further attenuate higher frequencies.

The output of common mode enhancement amplifier 224 is connected to the input of high pass filter 226, the output of which is connected to the input of high pass filter 229. Each of these high pass filters is a three pole active filter having a cutoff frequency at approximately 54 Hz.

The output of high pass filter 229 is connected to the input of sharp band pass filter 230. Filter 230 is comprised of a feedback loop having 360° phase shift at a selected frequency at a gain slightly less than 1. At the selected frequency, approximately 90° phase shift is provided by RC networks R34, R35, and C12; another 90° phase shift is provided by R36 and C13; and amplifier A9 shifts the signal an additional 180°. By varying the resistance of R34, the frequency at which 360° phase shift occurs can be varied slightly to tune the circuit for 360° phase shift at the frequency of the unwanted interference signal. Filter 230 functions as a band pass filter at the selected frequency. The "Q" of the filter can be varied by changing the position of switch S1. The circuit will have the lowest "Q" when S1 is connected in the terminal 1 position and the highest "Q" when connected to terminal 3. The output of the filter will be least sensitive to input signal amplitude variations when in position 3, but least responsive to frequency variations as well. The circuit will be most sensitive to frequency and amplitude variations when S1 is in position 1.

If the loop gain of filter 230 were one or greater at a frequency having 360° phase shift, it would oscillate; however, it is designed to have a gain slightly less than one at that frequency. If the input to the filter were to be disconnected, the output signal amplitude would gradually diminish.

Filter 230 is tuned to the frequency of the interference signal by potentiometer R34. Potentiometer R34 can best be adjusted by observing the amplitude of the output signal from filter 230 or one of the succeeding amplifiers on an oscilloscope and adjusting R34 for maximum signal amplitude.

The output from filter 230 is connected to the input of amplifier 232, which is in series with amplifiers 234, 236, 238, and 240. Each of the amplifiers, 232, 234, 236, 238, and 240, amplify the input signal by a factor of 10. The signal is AC coupled into each input to remove any DC offset that may have developed in the preceding amplifier. Zener diodes are connected, back-to-back, between the minus (−) and output terminals of operational amplifiers A10, A11, A12, A13, and A14 to prevent saturation and increase speed. Zener diode D11 prevents large negative excursions in the output of amplifier A15. The LED input to coupling unit 244 clamps the output of amplifier A15 in the positive direction.

The outputs from filter 230, and amplifiers 232, 234, 236, 238, and 240, are also connected, respectively, to terminals 1 through 6 of switch S2. The wiper of switch S2 is connected to the input of clock buffer 242, and to terminal T4, through resistor R8 and single-turn ferrite bead inductor L3, shunted by feed-through capacitor C21. Terminal T4 is intended primarily for test purposes; for adjusting R34, for example. Normally the signal appearing at the output of filter 230 will be a sine wave, but the amplitude thereof is subject to variation depending on the signal level at terminals T1 and T3. Following successive amplification through the times 10 amplifiers, the signal will become a square wave. During system operation, switch S2 should be left in a position so that the input to clock buffer 242 is a square wave.

As stated earlier, the wiper of switch S2 is connected to the input of clock buffer 242. This buffer may preferably be designed to drive an optic coupler, for example, the Hewlett Packard HP5082-4360 device shown in FIG. 3. Such a coupling device avoids coupling common mode noises, ground loops, or other undesired signals from the Reference Signal Amplifier to the remainder of the system.

Figure 3:
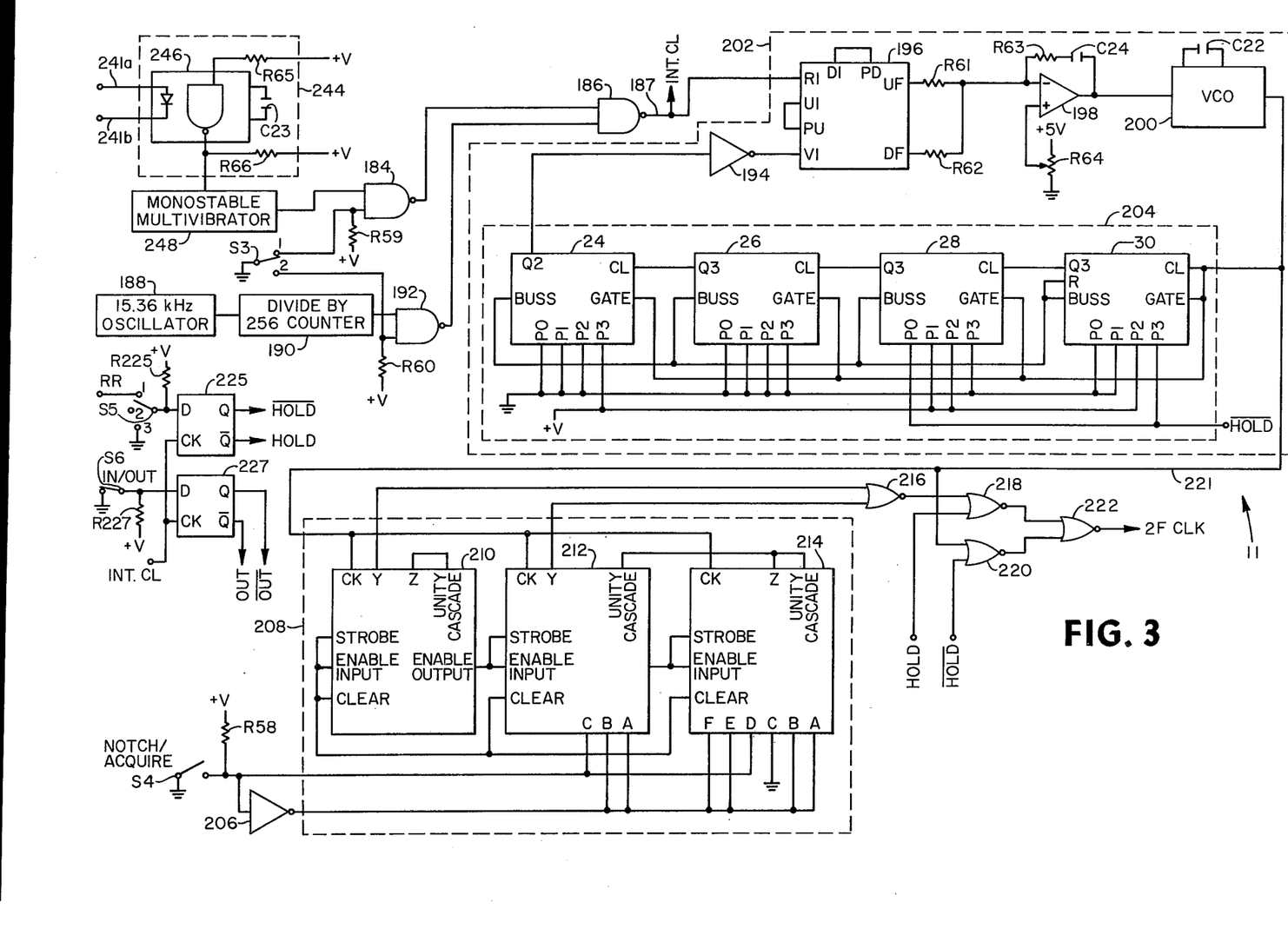
FIG. 3 is a circuit diagram of apparatus suitable for use as the clock generator illustrated in FIG. 1.

The circuit shown in FIG. 3 comprises Clock Generator 11 of FIG. 1. The output signal from clock buffer 242 on lines 241a and 241b is connected to the light emitting diode (LED) inputs to coupling unit 244 which, as stated before, may be comprised of an HP5082-4360 device manufactured by Hewlett-Packard, designated by reference numeral 246, and associated components. The output of coupling unit 244 is connected to the input of monostable multivibrator 248 which, for a 60 Hz input, may preferably be selected to have an "on" time of 14 milliseconds. The output from the monostable multivibrator is connected to an input of NAND gate 184, the other input of which is connected to terminal 1 of switch S3 and to pull-up resistor R59. If the system clock is to be locked to the interfering signal present in the area of operation, switch S3 is placed in the terminal 2 position.

Alternatively, the system may be operated from a fixed frequency oscillator. FIG. 3 shows such an oscillator designated by numeral 188. Oscillator 188 is at 15.36 KHz, and the output is connected to counter 190 which divides by 256 to yield a 60 Hz signal. The output signal from counter 190 is connected to an input of NAND gate 192, the other input of which is connected to terminal 2 of switch S3 and to pull-up resistor R60. To operate the system from the oscillator clock, switch S3 is switched to the terminal 1 position. It may be desirable to operate from a fixed frequency oscillator if the period of the interfering signal is precisely known and the interfering signal amplitude is low.

The output signals from NAND gates 184 and 192 are coupled to phase lock loop circuit 202 through NAND gate 186. The phase lock loop circuit may be constructed as shown, with the input, on line 187, connected to the R1 terminal of an MC4044 Phase-Frequency Detector manufactured by Motorola, designated by numeral 196. The Phase-Frequency Detector is connected in a standard manner and the output is amplified by amplifier 198. The resistor-capacitor network associated with amplifier 198 is selected for the desired loop response time and stability in a manner known to those skilled in the art. The output from amplifier 198 is connected so as to control the frequency of voltage controlled oscillator 200, which may be comprised of the MC4024 voltage-controlled multivibrator manufactured by Motorola. Capacitor C22 is selected to achieve the desired range of frequencies. The voltage controlled oscillator drives programmable frequency divider 204 which may be comprised of four MC4016 counters manufactured by Motorola. The four counters are interconnected so as to divide the input signal frequency by either 8064 or 8078 depending on the state of the HOLD input signal thereto. The purpose of changing the frequency division will be further discussed hereinafter.

The output of divider 204 is coupled back, through inverter 194, to the VI input of phase-frequency detector 196. The phase-frequency detector compares the input signals to terminals R1 and V1 thereof and generates a voltage signal proportional to the phase difference therebetween. This signal, after amplification and filtering, is applied to voltage controlled oscillator 200 to vary the frequency of oscillation until the phase of the output signal from counter 24 is "locked" to the phase of input signal on line 187. The frequency of the clock output from the phase lock loop on line 221 is thereby maintained at a multiple of the frequency of the input signal on line 187.

Line 221 connects the clock output from phase lock loop 202 into binary rate multiplier 208. The binary rate multiplier may be comprised of three SN7497 synchronous 6-bit binary rate multiplier devices manufactured by Texas Instruments. These rate multipliers, when appropriately interconnected as shown, generate a resulting clock signal equal to either 0.998974 or 0.999054 times the rate of the input on line 221. The rate multiplier output clock signal is generated by OR'ing, in OR gate 216, the signals from the Y terminals of rate multipliers 210 and 212. Depending on the state of the HOLD and HOLD input signals to NOR gates 218 and 220, respectively, either the clock output from the phase lock loop, which is applied to an input of NOR gate 220, or the rate multiplier output, which is applied to an input of NOR gate 218 is gated to NOR gate 222 to become the system clock, designated as 2F CLK, at the output of NOR gate 222.

The rate of rate multiplier 208 is varied by switch S4. With switch S4 open, appropriate logic level signals are applied to the rate multiplier to multiply the input signal thereto by 0.999054. With S4 closed, the rate multiplier controls are changed so as to generate an output at 0.998974 times the rate of the input thereto. The purpose of this change in rate multiplier 208 will be further discussed hereinafter, Also shown in FIG. 3 are flip-flops 225 and 227 which control operations of the system in response to the positions of switches S5 and S6. Switch S5 changes the system from Auto, to Notch/Acquire, and to Hold modes. With switch S5 in position 1, an input signal designated as RR which changes from a ONE level to a ZERO level at a selected time is applied to the D terminal of flip-flop 225. With switch S5 in position 2, a ONE logic level is applied to the D terminal of flip-flop 225, and with switch S5 in position 3 a ZERO logic level is applied to flip-flop 225. With a ONE logic level applied to the D terminal of flip-flop 225, INT CL, which is the output from NAND gate 186, will clock the Q output of the flip-flop 225 to a ONE state, which puts the system into the Notch/Acquire mode. When a ZERO logic level is applied to the D terminal, INT CL will trigger the Q output of flip-flop 225 to the ZERO state, which puts the system into the HOLD mode. In the Auto mode, the RR signal automatically switches the system from Notch/Acquire mode to Hold mode. The INT CL, which is synchronous with the interference signal, is used to clock the transition so that the mode change will be synchronous with the interference signal period. The significance of the Auto, Notch/Acquire, and Hold Modes will be discussed hereinafter.

Likewise, flip-flop 227 switches the system to the OUT or OUT state, depending on the position of switch S6.

Figure 4:
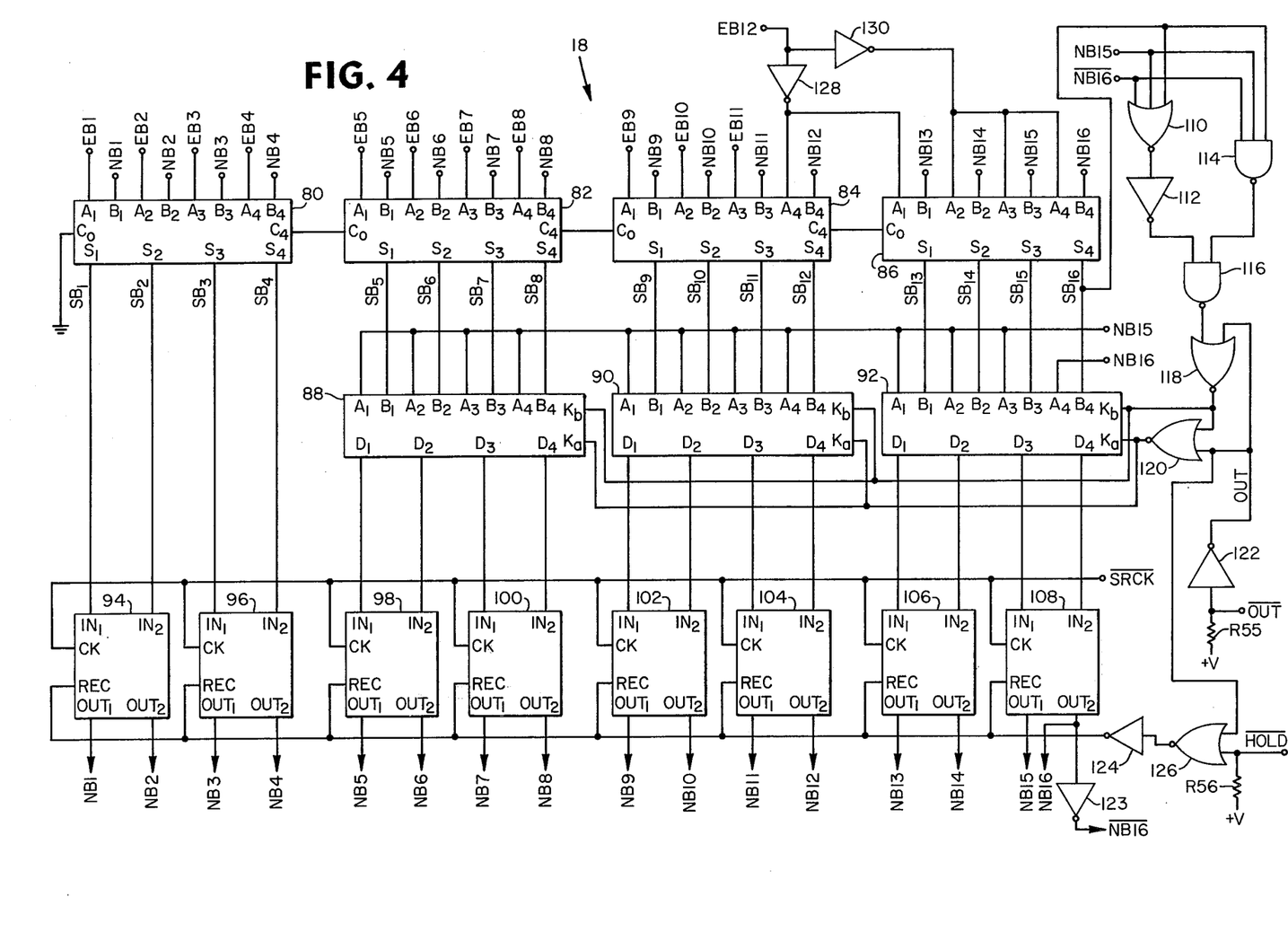
FIG. 4 is a circuit diagram of apparatus suitable for use as the memory section illustrated in FIG. 1.

FIG. 4 is a more detailed drawing of memory section 18. The circuit illustrated in FIG. 4 is designed specifically for a system that handles six channels of seismic or other data; however, those skilled in the art can readily adapt the configuration to handle more or fewer channels.

Memory circuits 94, 96, 98, 100, 102, 104, 106, and 108, which may be the 2527V Dual 256-Bit Shift Register devices manufactured by Signetics, are each comprised of two 256-bit shift registers. Digital words, from which the Channel Null signals are constructed, are stored in parallel in the registers. As the SRCK (Shift Register Clock) signal from the Control Unit advances the shift registers, the 16-bit words from which the Channel Null signals are generated appear at the output terminals thereof, designated as NB1-NB16 (Null Bit 1 through Null Bit 16). The digital word at the memory output is also connected back into the B input terminals of the adders 80, 82, 84, and 86, which may be the 74LS83 Four Bit Full Adder manufactured by Texas Instruments. These adders combine the 16-bit word from the memory output with the 12-bit word from analog-to-digital converter 4, designated in FIG. 4 as EB1-EB12 (Error Bit 1 through Error Bit 12). The least significant bit of both words are summed, and so on; except that the most significant bit from analog-to-digital converter 4 is inverted and summed with the five most significant bits from memory output. This arrangement combines 1/16 of the value of the "error word" from converter 4 with the "nulling word" from the memory output. Those skilled in the art will recognize that different fractional portions of the value of the "error word" can be combined with the nulling word in a binary adder.

A portion of the error word is combined with the nulling word to update the nulling word. The summation output word from the adder is normally reinserted in the memory as the succeeding digital word is shifted to the memory output.

Reset Gates 88, 90, and 92, which may be CD4019 Quad AND-OR Select Gates manufactured by RCA, are inserted between the adders and the memory shift registers, and prevent an erroneous digital word from being reinserted in memory should the summation of the two digital words at the adder inputs exceed full scale system capability.

Signals representing the complement of the most significant null bit (NB16) and the second most significant null bit (NB15), along with signal $SB_{16}$ (the most significant bit from adder 86 output) are connected to inputs of NOR gate 110 and NAND gate 114. The output from NOR gate 110 is inverted by invertor 112, the output which is connected to an output of NAND gate 116 along with the output from NAND gate 114. NAND gate 116 output is applied to an input of NOR gate 118 as is the OUT signal from inverter 122. NOR gate 118 output is applied to the $K_b$ terminals of gating circuits 88, 90, and 92, and to an input of NOR gate 120, the output of which is applied to the $K_a$ terminals of gating circuits 88, 90, and 92. The OUT signal is also applied to an input of NOR gate 120 and to an input of NOR gate 126. In the system described herein, 2's complement arithmetic is used. When signals NB16, NB15, and $SB_{16}$ all go to a ONE state, or to a ZERO state, full scale has been reached or exceeded. When the NB16, NB15, and $SB_{16}$ signals indicate that the output signal from the adders have reached or exceeded either plus (+) or minus (−) full scale, logic gates 118 and 120 cause the input signal to the B terminals of the reset gates to appear at the D output terminals thereof. The output from gates 88, 90, and 92, then, will be either the plus (+) or minus (−) full scale value, depending on the state of NB15 and NB16 (Null Bit 15 and Null Bit 16) which are applied to the A terminals of the gates 88, 90, and 92.

The OUT signal inhibits operation of the system herein described. Closing switch S6, shown on FIG. 3, causes a ZERO logic level to be applied to both the $K_a$ and $K_b$ terminals of reset gates 88, 90, and 92. These circuits then generate ZERO output levels for insertion into the memory. Digital words comprised of all ZERO's are then clocked into memory, and the resulting Channel Out signals from the subtracting amplifiers (see FIG. 1) will be the same as the Channel In signals.

When the system is operating in the Hold Mode, the HOLD input signal to NOR gate 126 goes to a ZERO state thereby applying a ZERO signal to the REC (Recirculate) terminals of the memory. In this mode, when the shift registers are advanced, the digital word at the output of memory is reinserted into the input. The Channel Null signals, in this mode, remain fixed. The OUT signal is also connected to an input of NOR gate 126 to prevent this recirculation of the memory contents when the system is switched to the OUT state.

The shift registers which comprise the memory have capacity for storing 256 words of 16 bits each. The individual words are stored in parallel; that is, the 16 bits of a given word appear simultaneously at the 16 output terminals of the shift register. The SRCK (Shift Register Clock) signal which is applied to the CK terminals of the shift registers causes the digital words to progress in sequence from the input stage of the shift register through all 256 steps to the output.

As stated earlier, each Channel Null signal is formed from 42 digital words, so that, for 6 channels, 252 digital words are required. Therefore, 4 stages of each shift register are unused, and 4 extra pulses are inserted into the SRCK wavetrain at the appropriate times as to advance the shift register past the 4 unused positions.

At the instant when the system described herein begins operations, memory circuits 94, 96, 98, 100, 102, 104, 106, and 108 may contain a random pattern of ONE's and ZERO's. The initial nulling signals constructed from this random pattern will not necessarily have any relation to the interference signal that it is desired to remove from the data signal. The initial nulling signal will, of course, be subtracted from the input signal containing the periodic interference signal, and error signals generated equaling the difference between the initial nulling signals and the input signals. It is apparent that when a portion of the error signals are combined with the nulling signals, the nulling signals will more closely approximate the interference signal. The process of subtracting the nulling signals from the input signals containing the interference, and then modifying the nulling signals by combining a fractional portion of the error signal with the nulling signal to update the nulling signal is repeated in an iterative manner, until the nulling signals substantially correspond to the periodic interference signal.

Figure 5:
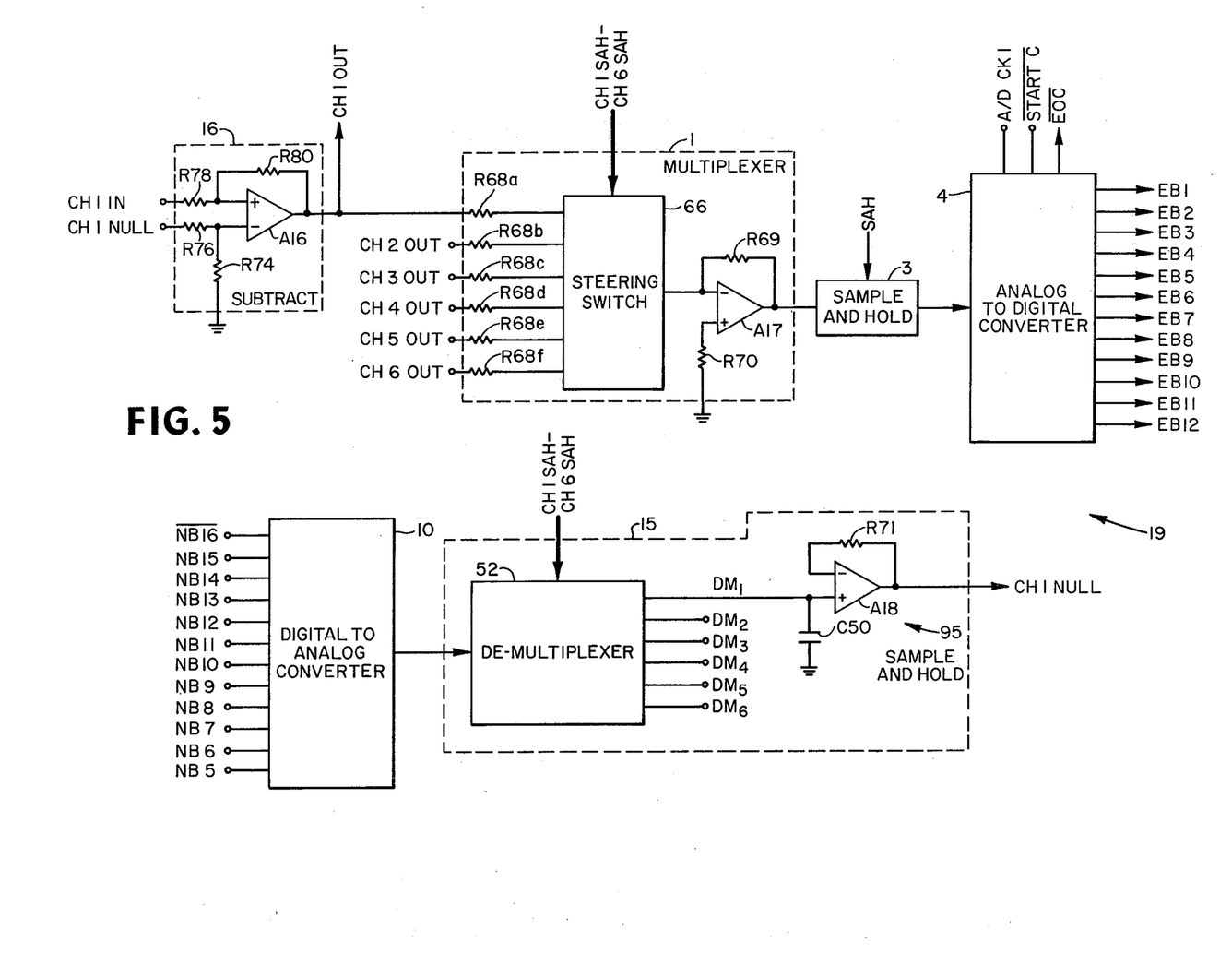
FIG. 5 is a circuit diagram of apparatus suitable for use as the analog section illutrated of FIG. 1.

Analog Section 19 is more fully illustrated in FIG. 5. The Channel 1 Null signal is subtracted from Channel 1 In signal by subtracting amplifier 16. Subtract amplifier 16 may be comprised of a CA1458 operational amplifier manufactured by RCA with an associated resistor network selected by methods known to those of ordinary skill in the art. The signal that is normally recorded for seismic analysis is taken from the output of this subtract circuit.

The output of subtract circuit 16 is coupled into multiplexer 1 through resistor R68a. Also shown connected into multiplexer 1 are the output signals from channels 2 through 6 (CH 2 OUT - CH 6 OUT). It is reemphasized at this point that although the preferred embodimemnt is described in terms of a six-channel system, it will be apparent to those of ordinary skill in the art that the system is adaptable for more or fewer channels. Multiplexer 1 may be comprised of steering switch 66 constructed from appropriately interconnected AD7519 Quad SPDT steering switch devices manufactured by Analog Devices and operational amplifier A17 with appropriately selected resistors.

Multiplexer 1 sequentially samples the Channel Out difference signals from the subtracting amplifiers and transfer voltage levels equivalent to the sampled input to sample-and-hold circuit 3. Sample-and-hold circuit 3, which may be comprised of a MN343 sample-and-hold amplifier device manufactured by Micro Networks Corp., samples the voltage levels presented by multiplexer 1 upon command from the SAH (Sample and Hold) signal from the Control Unit. Each sampled signal level is "held" for a sufficient time for analog-to-digital converter 4, which may be a MN5201 analog-to-digital converter manufactured by Micro Networks Corp., to generate a 12-bit digital word representative of the sampled voltage. The resulting 12-bit digital words, then, represents the "error" between the Channel Null signal and the Channel In signal on the seismic line at each sampling time. Signals designated as A/D CK 1 and Start C, which are generated in Control Unit 6, control analog-to-digital converter 4. Start C initiates the conversion of the analog input signal to a digital signal when it goes to a ZERO state. A/D CK 1 provides an external clock to sequence the converter through its conversion steps. When a conversion process is completed, the EOC (End of Conversion) output signal from analog-to-digital converter 4 goes to a ZERO state to indicate a Control Unit 6 that a conversion has been completed.

The circuit shown in the lower portion of FIG. 5 takes the digital signal from the output of the memory shown in FIG. 4 and converts this digital signal into an equivalent analog voltage. The twelve most significant bits, NB5 – NB15 and NB16 (null bit 5 through null bit 15 plus the complement of null bit 16) are shown connected to the input terminals of digital-to-analog converter 10, which may be a model DAC80 digital-to-analog converter from Burr Brown Research Corp.

The digital signals are converted to analog voltages by this digital-to-analog converter and the analog signals are applied to demultiplexer 52 which may be comprised of appropriately interconnected AD7510 Quad SPST analog switches manufactured by Analog Devices. The demultiplexer operates in response to control signals CH 1 SAH through CH 6 SAH generated by the Control Unit, selecting the appropriate signal to appear on the appropriate output line. For example, signals which are used to reconstitute the Channel 1 Null signal for channel 1 will appear on $DM_1$ (demultiplexer channel 1) output. Signals which are used to generate the channel 2 Null signal for channel 2 will appear on $DM_2$ output, and so on.

After each binary word is transformed into an analog voltage level and demultiplexed so as to appear on the appropriate channel, this voltage level is "held" by the selected sample-and-hole circuit for the duration of one digital sample. Each sample-and-hold circuit may be comprised of a CA1458T amplifier manufactured by RCA. This reconstructed analog signal is then subtracted from the seismic input signal.

Figure 6:
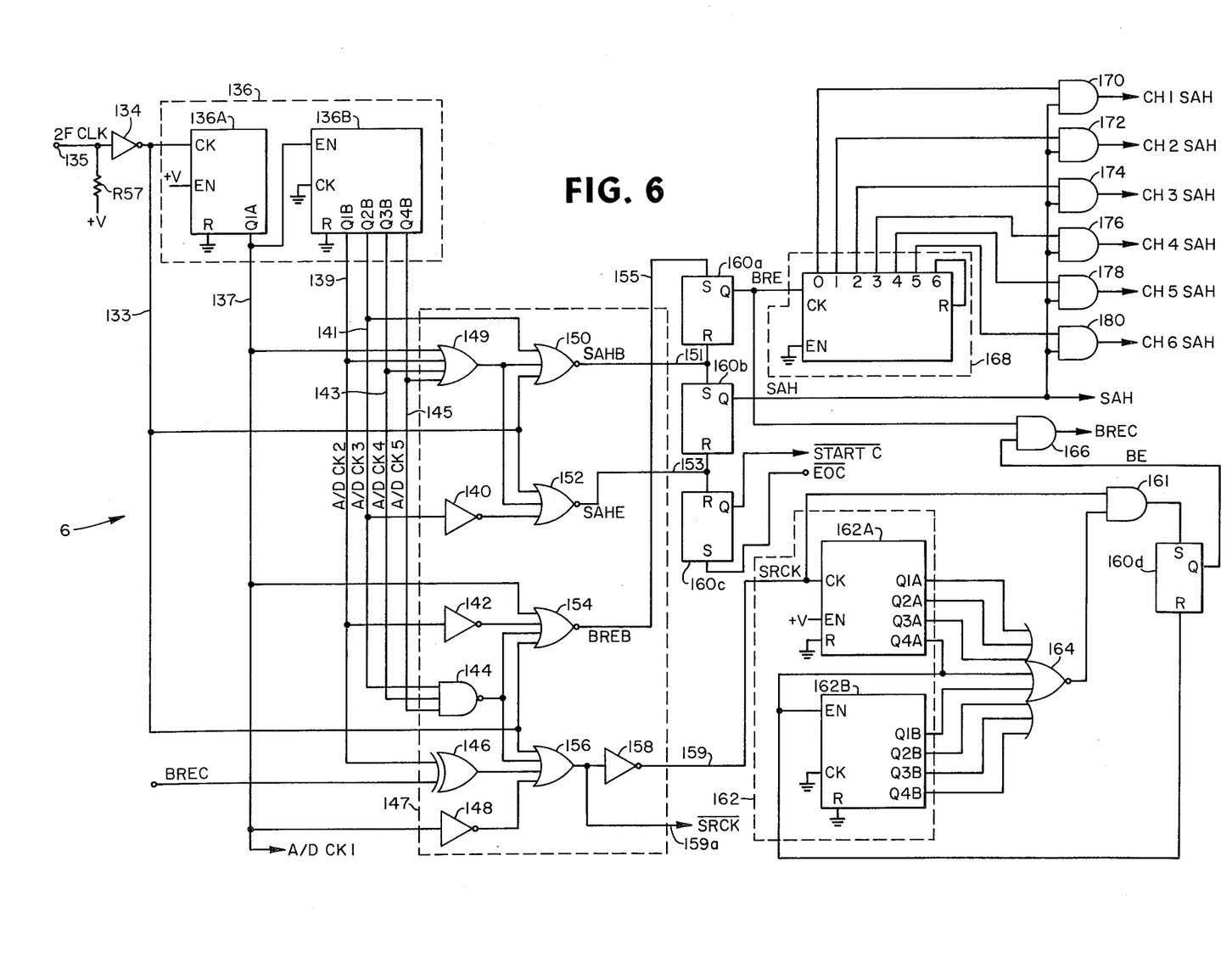
FIG. 6 is a circuit diagram of apparatus suitable for use as the control unit of FIG. 1.

FIG. 6 is a more detailed drawing of Control Unit 6. The 2F CLK clock input at terminal 135 is applied to inverter 134 which also has a pull-up resistor R57 connected between the input terminal thereof and plus voltage. The output of inverter 134 is connected to the clock input of counter 136. Counter 136 may be a CD4520B dual binary up-counter device manufactured by RCA, interconnected as a 5-stage counter. Counter 136 has output signals designated as A/D CK 1, A/D CK 2, A/D CK 3, A/D Ck 4, and A/D CK 5.

The output signals from counter 136 are connected to logic decode section 147. The A/D CK 1 signal on line 137 is connected to inputs of OR gate 149, NOR gate 154, and inverter 148. The A/D CK 2 signal on line 139 is connected to inputs of OR gate 149, inverter 142, and exclusive-or gate 146. The A/D CK 3 signal on line 141 is connected to inputs of NOR gate 150, inverter 140, and NAND gate 144. The A/D CK 4 signal appearing on line 143 is connected to inputs of OR gate 149 and NAND gate 144. The A/D CK 5 signal appearing on line 145 is connected to inputs of OR gate 149 and NAND gate 144. The 2F CLK signal from inverter 134 is also connected to inputs of NOR gate 150, NOR gate 152, NOR gate 154, and OR gate 156. The output from OR gate 149 is connected to inputs of NOR gates 150 and 152. The output of inverter 140 is connected to an input of NOR gate 152. The output of inverter 142 is connected to an input of NOR gate 154. The output of NAND gate 144 is connected to inputs of NOR gate 154 and OR gate 156. The output of exclusive-or gate 146 is connected to an input of OR gate 156. The output of inverter 148 is connected to an input of OR gate 156, and the output of OR gate 156 is inverted by inverter 158. The BREC (Bump Recirculate Enable Clock) signal which is generated as explained hereinafter is also connected to an input of exclusive-or gate 146.

Circuit 147 has output signals SAHB (Sample and Hold Begin), SAHE (Sample and Hold End), BREB (Bump Recirculate Enable Begin), SRCK (Shift Register Clock), and (SRCK) appearing on lines 151, 153, 155, 159, and 159A, respectively.

Line 151 (SAHB) is connected to the reset terminal of latch 160a and to the set terminal of latch 160b. Line 153 (SAHE) is connected to the reset terminal of latch 160b and to the reset terminal of latch 160c. Line 155 (BREB) is connected to the set terminal of latch 160a. The EOC (End of Conversion) signal from analog-to-digital converter 4 (see FIG. 5) is connected to the set terminal of latch 160c. Latches 160a, 160b, and 160c may be comprised of a CD4043A quad three-state R/S latch device manufactured by RCA. A ONE level input signal to the S terminal of latches 160a, 160b, 160c, or 160d causes the Q output thereof to go to a ONE state; a ONE level applied to the R terminal causes the Q output to go to a ZERO state. The SAHB signal sets latch 160b, causing the Q output thereof to go to the ONE state, and the SAHE signal resets latch 160b, causing the Q output to go to the ZERO state. The Q output of latch 160b, designated as SAH (Sample and Hold) is connected to an input of AND gates 170, 172, 174, 176, 178, and 180. The other input to these six AND gates come from the 6-stage counter 168. The clock input to counter 168 is driven from the Q terminal output of latch 160a. The BREB signal on line 155 sets latch 160a and the SAHB signal on line 151 resets latch 160a. Each negative transition of the output signal from terminal Q of latch 160a changes the state of counter 168.

Output terminals 0 through 5 of counter 168 successively generate ONE-level output signals which are applied to AND gates 170, 172, 174, 176, 178 and 180. When the respective output signal from counter 168 is at a ONE state, a ONE-level output signal is generated at the output of these gates in conjunction with a ONE-level on the SAH signal. Counter 168 may be an appropriately interconnected MC14022 counter-divider manufactured by Motorola.

The SAHE signal causes the Q output of latch 160c to go to a ZERO state, which initiates the conversion process in analog-to-digital converter 4, when the SAHE signal goes to a ONE state. Digital-to-analog converter 4 generates an EOC (End of Conversion) signal which goes to a ONE state when it begins the conversion process, which sets the latch 160c output back to a ONE state. The A/D CK 1 output from the Control Unit controls the sequencing of analog-to-digital converter 4.

The SRCK signal on line 159 is connected to the clock input terminal of 8-stage counter 162. This 8-stage counter may be an appropriately interconnected CD4520B device manufactured by RCA. Each of the eight "Q" output signals from counter 162 is connected to an input of NOR gate 164, the output of which is AND'ed with the SRCK signal in AND gate 161. The output of AND gate 161 is connected to the set input of latch 160d. Latch 160d may also be comprised of the CD4043 device manufactured by RCA. Latch 160d is reset by the signal from the Q4A terminal of counter 162. The Q output from latch 160d is connected to an input of AND gate 166, the other input of which comes from the Q terminal of latch 160a. AND gate 166 output generates the BREC signal which, as stated previously, is connected back into the input of exclusive-or circuit 146. The circuit comprised of counter 162, latch 160d, and AND gates 161 and 166 permit 256-bit shift registers to be used in the memory when only 252 stages of the registers are utilized. Four additional pulses are generated in SRCK each time it cycles through a period. In other words, each Channel Null signal is comprised of 42 digital words so that for a six channel system, 252 digital words are required to construct one period of six Channel Null signals. The SRCK clock to the memory shift registers contains four extra clock pulses which "bump" the shift registers past the four unused positions.

The system operates in three distinct conditions: Acquire, Notch, and Hold. In the Notch Mode, the Channel Null signals are continually updated by combining a portion of the "error" signals with the "nulling" signals. This mode has the advantage of maintaining the nulling signals at a very close approximation of the interfering signal that it is desired to eliminate. In this mode the nulling signals continue to be updated while seismic data is being recorded. Normally, the seismic data will be of much smaller amplitude than the interfering signal so that the presence of the seismic data on the electrical Channel In signal from which the nulling signal is subtracted will not significantly affect the "error" signal. The disadvantage of this mode is that the distortion of signals near the fundamental and harmonics thereof of the interfering signal that is characteristic of notch filters will be present.

In the Notch mode, switch S5 is placed in position 2 (Notch/Acquire) and Switch S4 is in the open position (Notch). With S4 and S5 in these positions, programmable frequency divider 204 divides its input frequency by 8078 and rate multiplier 208 multiplies its input frequency by 0.998974. In this mode, therefore, the period of the nulling signals are equal to 0.999787 of the interference signal period. This means that the nulling signal is running at a slightly faster frequency than the interference signal. The nulling signal is generated at a slightly higher frequency in the embodiment described herein because the difference between the interfering signal and nulling signal is sampled at the beginning of a "step" of the nulling signal to update the nulling signal. If the beginning of the "steps" of the nulling signal equals the amplitude of the interfering signal, some residual signal at the frequency of the interfering signal would remain after the two signals are subtracted because the signals would be unequal for the point at the beginning of a nulling signal step. Optimum cancellation of the interfering signal occurs if the nulling signal amplitude equals the interfering signal amplitude at the center of a "step" of the nulling signal. Generating the nulling signal at this slightly faster frequency achieves this optimum cancellation.

Most frequently, the system will initially function in the Acquire Mode. In the Acquire Mode, S5 is placed in position 2, and S4 is placed in the closed position (Acquire). Programmable frequency divider 204 divides its input frequency by 8078 as in the Notch Mode, but rate multiplier 208 now multiplies its input frequency by 0.999054, so that the nulling signal period is somewhat less than in the Notch Mode. The period of the nulling signal is slightly less than the period of the interfering signal in Acquire Mode, also.

Acquire Mode is similar to Notch Mode in that the nulling signal is continually updated as a function of the error signal. Seismic data will not normally be recorded in this mode however. The system will be switched to Hold mode by moving S5 to position 3 when it is desired to record data. Changing to Hold Mode changes programmable frequency divider 204 so that it now divides its input frequency by 8064. The period of the nulling signal will now equal the period of the interfering signal and the amplitude of the nulling signal at the center of its steps will be substantially equal to the interfering signal at that point. The nulling signals are no longer updated in Hold Mode, and the phase distortion characteristic of Notch filler will not occur. With switch S5 in position 1, the system in automatically switched from Acquire to Hold mode by control signal RR.

What is claimed is:

1. An iterative method for reducing the amplitude of an unwanted periodic signal in an electrical signal which may include a data signal, which comprises:
   a. generating a nulling signal having a period slightly less than the period of the unwanted periodic signal;
   b. subtracting said nulling signal from said electrical signal to generate an error signal;
   c. sampling the amplitude of the error signal at discrete intervals;
   d. combining a fraction of each discrete sample of the error signal with the corresponding portions of the nulling signal to generate an updated nulling signal;
   e. repeating steps (b) – (d) a plurality of times wherein the updated nulling signal replaces the nulling signal during each repetition.

2. The method of claim 1 wherein steps (b) – (d) are repeated at least until the nulling signal waveform is substantially equal to the unwanted periodic signal waveform and thereafter increasing the period of the nulling signal to equal the period of the unwanted periodic signal and retaining the last generated updated nulling signal and repetitively subtracting said last generated updated nulling signal from said electrical signal and recording the signal resulting from said subtraction.

3. A method for reducing the amplitude of an unwanted periodic signal that is present in an electrical signal that may include a data signal, which comprises:
   storing in memory a first series of digital words;
   generating a nulling signal having a waveform which progresses in a sequence of discrete steps so as to approximate the waveform of said periodic signal and having a period slightly less than the period of the unwanted periodic signal, the amplitude of said discrete steps being representative of said first series of digital words;
   subtracting said nulling signal from said electrical signal, thereby generating an error signal; and
   modifying said first series of digital words by a function of said error signal so as to reduce said error signal during succeeding periods of said unwanted signal.

4. The apparatus of claim 3 wherein said nulling signal progresses in a sequence of 42 discrete steps during each period thereof.

5. The method of claim 3 further comprising:
   generating a second series of digital words representing said error signal, each digital word in said second series representing the difference between said electrical signal and said nulling signal during succeeding intervals of said nulling signal; and
   said first series of digital words are modified by summing algebraically 1/16 of said second series of digital words with said first series of digital words.

6. Apparatus for removing a periodic interference signal from seismic signals comprising:
   a memory for storing a plurality of digital words;
   a plurality of subtracting circuits, each subtracting circuit adapted to subtract a nulling signal from a seismic signal;
   a multiplexer which sequentially transfers samples of the subtracting circuit output signals to a multiplexer output;
   means for converting said samples into equivalent digital words;
   means for combining at least a portion of the value of said equivalent digital words with corresponding digital words stored in memory and replacing said corresponding words with the combined digital words;
   means for converting said digital words stored in memory into equivalent analog signals to generate said nulling signals; and
   means for channelling the appropriate nulling signal to each subtracting circuits.

7. The apparatus of claim 6 further including control circuit means for generating said nulling signals periodically in selected relation to the period of the unwanted interfering signal.

8. The apparatus of claim 7 wherein said control circuit means includes means for changing the period of the nulling signals from a first selected period slightly less than the period of the interfering signal to a period equal to the period of the interfering signal.

9. Apparatus for reducing the amplitude of an unwanted periodic signal that is present in an electrical signal that may include a data signal, which comprises:
   a memory for storing a first series of digital words;
   means for generating a nulling signal having a waveform which progresses in a sequence of discrete steps so as to approximate the waveform of said unwanted periodic signal and having a period slightly less than the period of the unwanted periodic signal, the amplitude of said discrete steps being representative of said first series of digital words;
   means for subtracting said nulling signal from said electrical signal, thereby generating an error signal; and
   means for modifying said first series of digital words by a function of said error signal so as to reduce said error signal during succeeding periods of said unwanted signal.

10. The apparatus of claim 9 further including means for selectively increasing the period of the nulling signal to equal the period of the unwanted periodic signal.

11. A method for reducing the amplitude of an unwanted periodic signal that is present in a plurality of electrical signals which may include data signals, which comprises:
    storing in memory a plurality of digital words;
    subtracting in a plurality of subtracting means nulling signals from said plurality of electrical signals;
    transferring sequentially through a multiplexer samples of the output signals from said subtraction;
    converting said samples into equivalent digital words;
    combining at least a portion of the value of said equivalent digital words with corresponding digital words stored in memory and replacing said corresponding words with the combined digital words;
    converting said digital words stored in memory into equivalent analog signals to generate said nulling signals; and
    channeling the appropriate nulling to each subtraction means.

* * * * *